US005821751A

United States Patent [19]
Wendt et al.

[11] Patent Number: 5,821,751
[45] Date of Patent: Oct. 13, 1998

[54] METHOD FOR MAGNETIC RESONANCE IMAGE ACQUISITION AND RECONSTRUCTION OF THE BASIC OF WAVELET ENCODING

[75] Inventors: Michael Wendt, Cleveland Heights, Ohio; Martin Busch, Berlin, Germany

[73] Assignee: Siemens Aktiengesellschaft, Munich, Germany

[21] Appl. No.: 747,901

[22] Filed: Nov. 14, 1996

[30]    Foreign Application Priority Data

Nov. 24, 1995 [DE]  Germany .......................... 195 43 891.4

[51] Int. Cl.⁶ .................................................. A61B 5/055
[52] U.S. Cl. ............................................ 324/307; 324/309
[58] Field of Search .................................... 324/300, 306, 324/307, 309; 600/410

[56]             References Cited

U.S. PATENT DOCUMENTS

| | | | |
|---|---|---|---|
| 5,148,109 | 9/1992 | Takane et al. | 324/309 |
| 5,168,226 | 12/1992 | Hinks . | |
| 5,200,701 | 4/1993 | Siebold et al. . | |
| 5,474,067 | 12/1995 | Laub . | |
| 5,682,891 | 11/1997 | Sonoki et al. | 324/307 |
| 5,687,725 | 11/1997 | Wendt | 324/307 |

FOREIGN PATENT DOCUMENTS

| | | |
|---|---|---|
| 0 191 431 | 2/1989 | European Pat. Off. . |
| 195 28 436 | 2/1997 | Germany . |

OTHER PUBLICATIONS

"Adapted Waveform Encoding for Magnetic Resonance Imaging," Healy, Jr. et al., IEEE Engineering in Medicine and Biology, Sep./Oct. 1995 pp. 621–638.
"A Dynamically Adaptive Imaging Algorithm for Wavelet–Encoded MRI," Panych et al., MRM vol. 32, (1994), pp. 738–748.
"Image Formation by Nuclear Magnetic Resonance: The Sensitive–Point Method," Hinshaw, J. App. Phys., vol. 47, No. 8, Aug. 19, 1976, pp. 3709–3721.
"Keyhole Imaging Offers Shortcut to Fast MR Scans," Diagnostic Imaging, Feb., 1993, p. 36.
"Image Formation by Nuclear Magnetic Resonance: The Sensitive–Point Method," Hinshaw, J. App. Phys., vol. 47, No. 8, pp. 3709–3721, Aug. 19, 1976.

*Primary Examiner*—John E. Barlow, Jr.
*Assistant Examiner*—Michael Eisenberg
*Attorney, Agent, or Firm*—Hill & Simpson

[57]              ABSTRACT

For obtaining image information from a subject, in an excitation phase nuclear resonance signals are excited with wavelet-encoding by emitting a radio-frequency pulse under the influence of a gradient in a first direction, the pulse having an envelope that corresponds to the Fourier transforms of a wavelet function. In addition, a layer selection is achieved by the application of an oscillating gradient in a second direction. In a readout phase, a gradient echo signal is sampled under the influence of a readout gradient in a third direction. The pulse sequence can be repeated with a repetition time that is shorter than the longitudinal and transverse relaxation time, so that a steady state arises.

15 Claims, 5 Drawing Sheets

FIG. 2
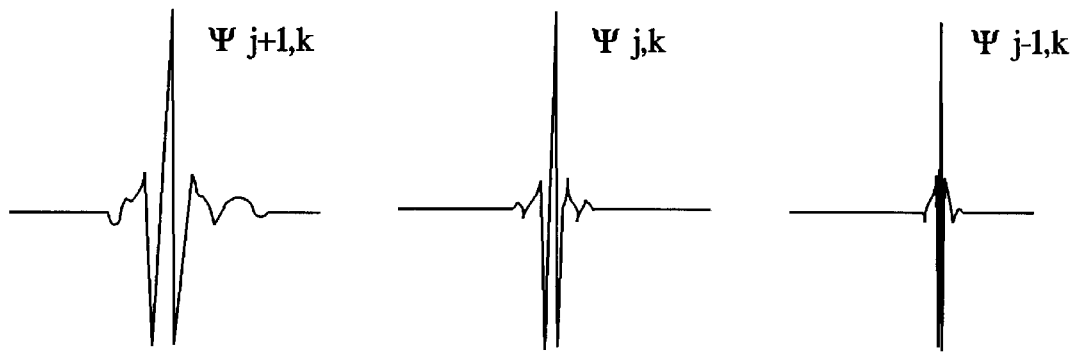
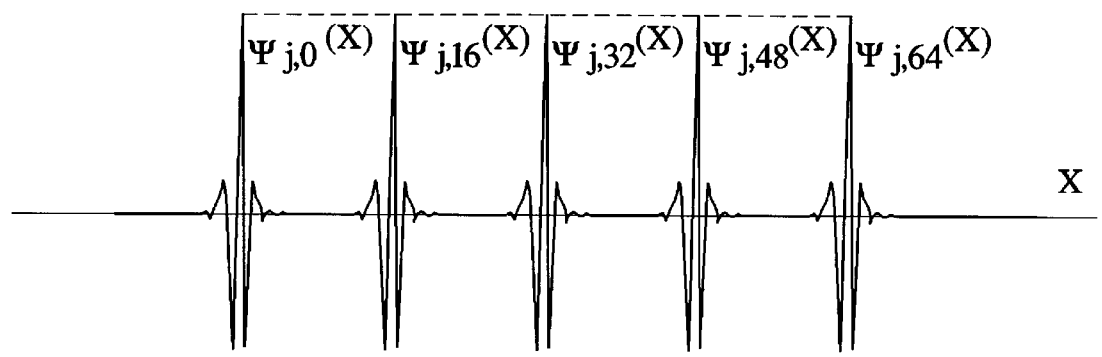
FIG. 3

METHOD FOR MAGNETIC RESONANCE IMAGE ACQUISITION AND RECONSTRUCTION OF THE BASIC OF WAVELET ENCODING

BACKGROUND OF THE INVENTION

1. Field of the Invention

The present invention is directed to a method for the acquisition of image data from nuclear magnetic resonance signals.

2. Description of the Prior Art

Despite considerable progress in shortening data acquisition time for MR imaging, for real-time exposures of dynamic (motion-containing) processes MR imaging remains limited, in particular if at the same time a good local resolution is required. In many cases, however, it is known from the outset that motions are to be expected substantially only in narrowly limited regions of the subject, or motions are of interest only in such a narrowly limited region. This is the case, e.g., in interventional nuclear spin tomography.

With certain magnetic systems for nuclear spin tomographic devices, such as are marketed e.g. by Siemens under the designation "MAGNETOM OPEN®," a relatively good accessibility to the patient is offered during the examination. This allows interaction with the patient using interventional instruments during the MR imaging. Typical applications are e.g. surgery and biopsy, whereby the respective position of the instrument can be observed on a screen. Of course, chronologically and spatially precise information about the respective position of the instrument in the body is required for these procedures. A real-time monitoring of the instrument position at the required spatial resolution and at a sufficiently large contrast-noise ratio, however, places extreme demands on the speed of the data acquisition and processing, if the entire raw data set is to be updated.

From the article "Keyhole Imaging Offers Short Cut to Fast MR-Scans," in Diagnostic Imaging, February 1993, page 36, it is known to improve the time resolution in MR imaging by intentionally obtaining a less than complete data set during each individual sequence repetition. Rather, in the context of this keyhole technique, as it is called, only a fast update of the average k-space lines ensues. A conventional Fourier transformation technique is used, in which these average k-space lines substantially determine the signal-noise ratio. Similar techniques for time-resolved MR imaging are known from the U.S. Pat. No. 5,168,226 and from the German letters patent DE 43 27 325. In obtaining several raw data matrices at different time points of a motion sequence, signals for two chronologically successive raw data matrices are thereby used, i.e. for each image obtained only a part of the raw data lines are updated. The time advantage is proportional to the non-updated raw data lines. The above-named techniques have the disadvantage that the resolution decreases for the representation of moving subjects, to an extent governed by the percentage of the raw data which is non-updated.

From the articles L. P. Panych et al., "A Dynamically Adaptive Imaging Algorithm for Wavelet-Encoded MRI," in Magnetic Resonance in Medicine 32, pages 738 to 748 (1994), and L. P. Panych et al., "Implementation of Wavelet-Encoded MR Imaging," in Journal of Magnetic Resonance Imaging, 1993, 3, pages 649 to 655, it is known to use wavelet transformations as an alternative to phase encoding and to conventional Fourier transformation. In contrast to conventional Fourier transformation, wavelet functions are spatially localized, i.e. wavelet profiles are generated at different places via the observation window. In contrast, the discrete Fourier transformation always covers the entire field of observation. The discrete Fourier transformation converts a periodic signal from the locus space into the frequency space, but does not supply information about the time and place at which a particular frequency has occurred.

In the above-identified article "A Dynamically Adaptive Imaging Algorithm for Wavelet-Encoded MRI," the spatially selective characteristic of the wavelet transformation is used to acquire motions in the observation window and to update only the raw data for the regions in which a motion actually occurs. A motion of direction in the direction of the wavelet encoding is thereby assumed.

With the use of interventional instruments in a body, the motion direction is usually known from the outset. Often it need only be determined how far the interventional instrument has been inserted into the body, e.g. in order to contact particular organs for the surgery or biopsy and to avoid damage to other organs during the insertion of the interventional instrument.

In prior German patent application 195 28 436, it was thus proposed to provide the raw data sets with a frequency encoding in the direction of the path of motion and with a wavelet encoding in a direction perpendicular thereto, and to update only wave encodings allocated to the region of the path of motion.

Since the path of motion is relatively well known, only a small part of the nuclear resonance signals need be updated, so that the data acquisition time is reduced correspondingly and the time resolution increases. In contrast to the above-named method according to Panych, here the data set for the entire region of the path of motion is always updated, so that the entire instrument inside the subject of examination is represented with good local resolution due to the averaging over several measurements. In the method according to Panych, however, data sets are updated only for the regions in which a change occurs. In the present case, this is the case only in the region of the tip of the instrument.

In contrast to the known keyhole technique or the use of data lines for several temporally successive images, here the spatial localization of the wavelet function is exploited.

The above-named techniques have in common that the nuclear resonance signals are read out as spin echoes, i.e. after a refocussing through a 180° radio frequency pulse. This is due to the fact that the required layer selection is achieved by means of layer-selective refocussing. The layer selection used in the standard phase and frequency encoding through activation of a constant gradient cannot be used for the wavelet encoding.

Spin echo sequences, however, are relatively slow. The time advantage gained by updating of a partial region of the raw data matrix using the local selectivity of the wavelet encoding is thus partly lost again.

In the article "Adapted WaveForm Encoding For Magnetic Resonance Imaging" by Healy et al in IEEE Engineering in Medicine and Biology, September/October 1995, pp. 621–638, wavelet encoding possibilities are likewise explained. A local resolution is thereby achieved in a first direction by means of a (layer-selective) wavelet encoding, a local resolution is achieved in a second direction by means of a phase encoding, and in a third direction by means of a frequency encoding. It is true that one can produce three-dimensional image data sets in this way, but the data acquisition time is relatively long due to the large number of phase encoding steps required.

SUMMARY OF THE INVENTION

An object of the present invention is to achieve faster pulse sequences using wavelet encoding.

The above object is achieved in accordance with the principles of the present invention in a method for obtaining image information from a subject including the steps of, in an excitation phase, generating an RF pulse in a homogenous magnetic field, the RF pulse having an envelope corresponding to the Fourier transforms (dilation and translation) of a wavelet function, generating a constant magnetic field gradient in a first direction during emission of the radio frequency pulse, and also generating a further magnetic field gradient, having a time-varying amplitude and a linear local dependency, in a second direction. In a readout phase, a gradient echo signal, produced during the excitation phase, is sampled, digitized and entered into a line of a raw data matrix under a readout gradient in a third direction. The steps respectively constituting the excitation phase and the readout phase are repeated N times with a different wavelet encoding for each repetition, thereby generating a raw data matrix with N lines. An image matrix is produced by Fourier transformation of the raw data matrix in the third direction and wavelet transformation of the raw data matrix in the first direction.

The invention makes use of a gradient echo sequence which, as is generally known, can be carried out with considerably shorter repetition times than spin echo sequence.

DESCRIPTION OF THE DRAWINGS

FIG. 2 shows wavelets with three different dilations a.

FIG. 3 shows the translation of the wavelet functions over the subject.

DESCRIPTION OF THE PREFERRED EMBODIMENTS

Figure 1:
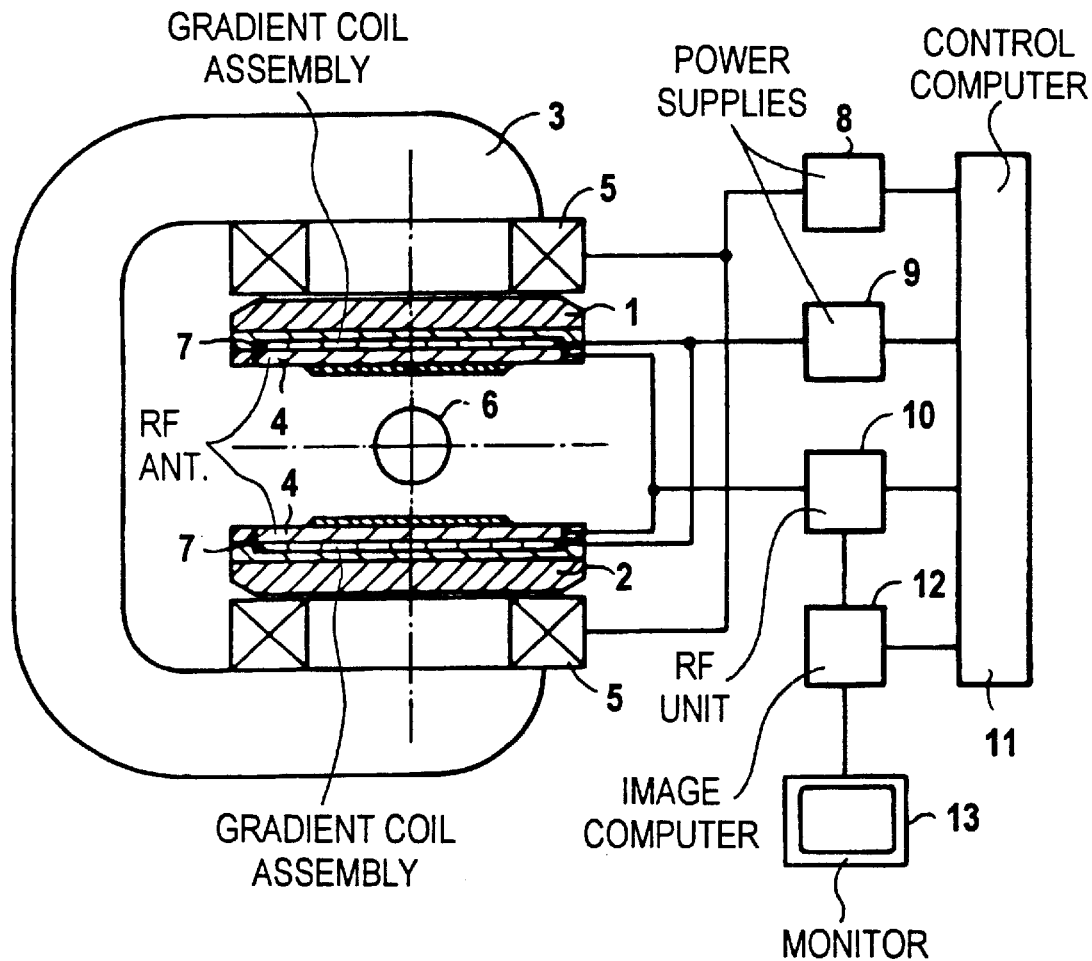
FIG. 1 a schematic view of the design of an open magnetic system of known construction.
Figure 4:
FIGS. 4 to 8 show an exemplary embodiment of the invention for a pulse sequence with wavelet encoding and gradient echoes.
Figure 5:
Figure 6:
Figure 7:
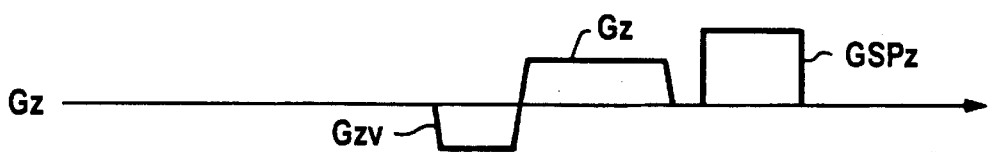
Figure 8:

FIG. 1 schematically shows a known pole shoe magnet of a nuclear spin tomography apparatus with a C-shaped yoke, as is disclosed in U.S. Pat. No. 5,200,701. The magnetic drive ensues in the exemplary embodiment according to FIG. 1 through normally conductive magnetic coils 5. Gradient coil assemblies 7 and radio-frequency antennas 4 are respectively attached in the region of pole shoes 1 and 2. In the exemplary embodiment, the radio-frequency antennas 4 serve both for the transmission and the reception of signals. An examination subject 6 is positioned in the magnet.

The magnetic coils 5 are fed by a magnet power supply 8, and the gradient coil assemblies 7 are fed by a gradient power supply 9. The antennas 4 are connected with a radio frequency unit 10. Using an image computer 12, an image is reconstructed from the signals obtained by the radio frequency unit 10, which image is shown on a monitor 13. The magnet power supply 8, the gradient power supply 9, the radio frequency unit 10 and the image computer 12 are controlled by a control computer 11.

The foundations of wavelet transformation are explained in detail in the references identified above, and are presented here only in outline. The integral wavelet transformation $F_{g(a,b)}$ of a real-valued, energy-limited function f(x) is given by:

$$F_g(a, b) = \frac{1}{\sqrt{a}} \int f(x) \cdot g\left(\frac{x-b}{a}\right) dx$$

A wavelet function g(a,b) arises through dilation and translation of a base wavelet function, i.e., in contrast to the Fourier transformation, the wavelet transformation maps on two parameters. The dilation "a" thereby influences the width of a wavelet function g(a,b) and the translation "b" of its position in the subject space. A series of functions are known that can be used as base wavelet functions. Battle-Lemarie wavelets are used in an exemplary embodiment. The wavelet function that arises is schematically shown in FIGS. 2 and 3. The index j thereby designates the dilation and the index k designates the translation of the base wavelet function. FIG. 2 shows the dilation of the base wavelet function $\Psi_{j,k}$ for three different dilatations a. In each dilatation, according to FIG. 3 the wavelets are pushed over the subject in a spatial direction. Of the translations, which run from 0 to 64, only every sixteenth translation is drawn. The other translations are indicated by points. Corresponding to the dilation parameters, arbitrarily broad subject windows can be produced, from which the raw data are then read out. A broad windowing (equivalent to small a) of the subject region corresponds to a lowpass filtering, while the wavelet function becomes narrower as a increases, and thereby increasingly takes on a high-pass characteristic.

FIGS. 4 to 8 show the application of the wavelet encoding in a gradient echo pulse sequence. For the wavelet encoding of the signals, first a radio frequency pulse RF1 is emitted under the influence of a gradient Gx. The frequency spectrum of the radio frequency pulse RF1 thereby defines the dilation and translation of the wavelet function in connection with the gradient Gx. A strip profile perpendicular to the direction of the gradient Gx can thereby be purposely chosen. For small flip angles of the radio frequency pulse RF1, the envelopes of these radio frequency pulses and the strip profile required here are a Fourier-transform pair. The dilation a and the strength of the gradient Gx are related proportionally to one another. By means of amplification of the gradient Gx, a is thus enlarged, and the strip width is thereby reduced. The desired translation b can be achieved by displacement of the center frequency of the radio frequency pulse RF1 or by means of an offset of the gradient Gx. The gradient Gx is subsequently inverted in order to cancel the dephasing caused by the positive partial pulse. At the same time, a pre-phasing is achieved emitting a first gradient pulse Gz in the negative z direction.

Figure 10:
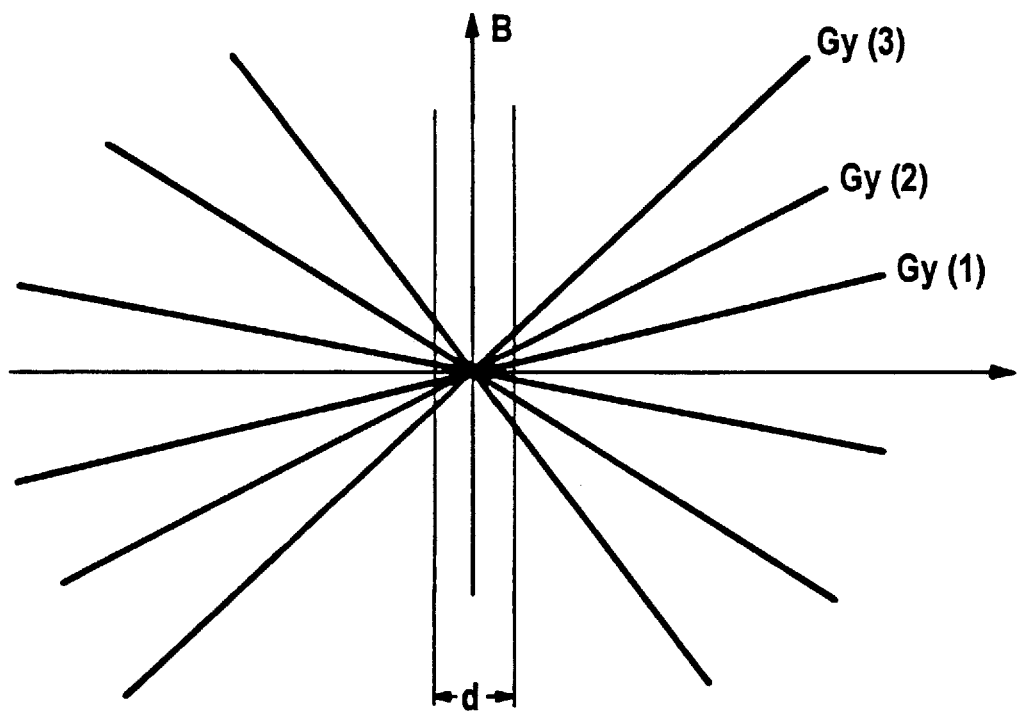
FIG. 10 shows the local and time dependence of the gradient in the second direction.

In contrast to known wavelet-based methods, in the exemplary embodiment a layer selection is already carried out during the excitation, and thus does not take place for the first time during a subsequent refocussing. For this purpose, during the emission of the radio frequency pulse RF1, in addition to the gradient Gx in the first direction a second gradient Gy is emitted in a second direction perpendicular to the first. The strength of this gradient Gy oscillates about a zero line. In the present exemplary embodiment, the gradient Gy has a sinusoidal shape, since the high gradient amplitudes and oscillation frequencies required here are most easily achieved by means of a resonant circuit in which the gradient coil functions as an inductance. The effect of this gradient Gy is illustrated on the basis of FIG. 10. FIG. 10 shows the magnetic field curve B in the y-direction for six different times in which the gradient Gy has six different strengths. With the time-dependent Gy gradient, a local and time dependency is thereby impressed on the homogeneous basic magnetic field in the second direction.

As is well known, the nuclear spins are excited only when an excitation occurs at the Larmor frequency associated therewith. Since this Larmor frequency is dependent on time and on the prevailing local magnetic field, in the present case a time- and locus-dependent excitation of the nuclear spins ensues.

The nuclear spins experience an excitation over the entire length of the radio frequency pulse RF1 only in a region around the location of the zero crossing of the magnetic field gradient Gy, thus defining a layer perpendicular to the y axis. Outside this layer, the resonance condition is indeed briefly fulfilled with each zero crossing of the oscillation of the gradient Gy. In these short time segments, no appreciable cross-magnetization can be produced, i.e. the flip angle outside the layer remains very small.

The thickness d of the layer in which an appreciable excitation of the nuclear spins ensues is determined by the following factors:

First, the extent to which an excitation also occurs at particular local magnetic field deviations from the basic magnetic field depends on the bandwidth of the excitation pulse RF. Second, the thickness d of the selected layer is determined by the frequency and the amplitude of the oscillating gradient Gy. The higher the amplitude of this gradient, the thinner the thickness d becomes. The thickness d of the layer also becomes narrower given a higher frequency of the oscillations of the gradient Gy. More precise statements concerning the connection between the selectivity of an excitation under the effect of an oscillating gradient are to be found in the article by W. S. Hinshaw, "The Sensitive Point Method," Journal of Applied Physics, vol. 47, no. 8, August 1976. A series of parameters are thus available for the setting the desired layer thickness d in the y direction. The position can be defined through the position of the zero crossing of the straight bundle according to FIG. 10.

Figure 11:
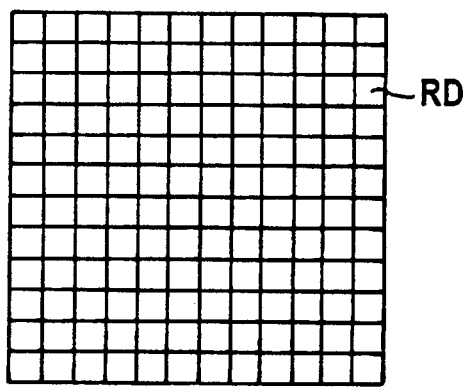
FIG. 11 is a schematic view of a raw data matrix using the exemplary embodiment obtained of the invention.

In the following readout phase, a positive gradient pulse Gz is activated. The dephasing caused by the negative gradient pulse Gzv is thereby canceled. In a known way, there arises a nuclear resonance signal in the form of a gradient echo, which is sampled M times in an acquisition window ADC under the influence of the gradient Gz. The gradient echo signal is thereby frequency-coded in the z-direction in a conventional manner. The signal is entered into a line of a raw data matrix RD according to FIG. 11, in a way similar to conventional Fourier transformation methods.

The wavelet encoding here replaces the otherwise standard phase encoding of the nuclear resonance signals. As in the phase encoding, in the wavelet encoding N measurements with different wavelet encoding must be carried out in order to fill N fully resolved lines of the image matrix. As already stated above, these N measurements are carried out with different dilations and translations of the base wavelet function. For the following application, a special feature of the wavelet coefficients in comparison with the Fourier coefficients is important: the wavelet coefficients correlate with a defined segment of the subject space, corresponding to their dilation and translation.

From the raw data matrix RD obtained in this way, with M×N measurement values, an image can now be reconstructed according to methods explained in the references indicated in the introduction to the specification.

By the use of gradient echoes in place of the spin echoes known in connection with wavelet encoding, a considerable reduction of the data acquisition time can be achieved. In particular, as in the FLASH method known from European Application 0 191 431, the repetition time can be selected shorter than the longitudinal and transverse relaxation time of the excited nuclear spins, so that a steady state becomes established. As in the FLASH method, the flip angle of the excitation pulse RF1 is selected smaller than 90°.

In order to create the same preconditions for each excitation in a sequence with a faster repetition rate, after the readout phase, residual phase coherences can be prevented by spoiler gradients GSPx, GSPy, GSPz in the x, y and z directions, respectively.

With the use of wavelet encoding with a rapidly repeated gradient echo sequence, acquisition times of 10 seconds are achieved for a complete image from a layer. The particular advantage of the local selectivity of the wavelet encoding comes to bear when only a small part of the image data matrix is updated. Acquisition times of less than half a second can thereby be achieved, so that the method is particularly suited for real-time exposures in interventional MR examinations.

Figure 9:
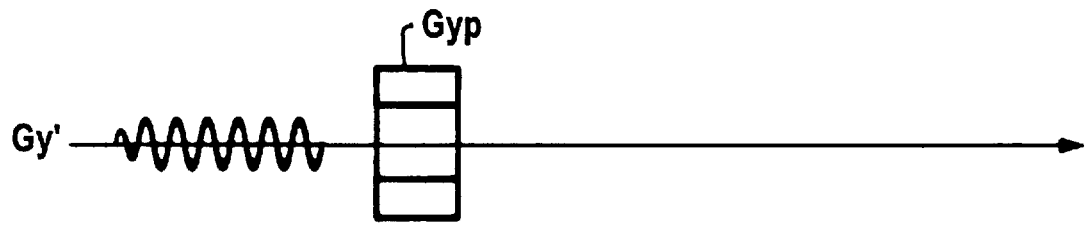
FIG. 9 shows the application of a phase encoding gradient in the second direction in the method.

A precise local resolution in three dimensions is often required precisely in interventional techniques. The design shown also enables another local resolution inside the selected layer, if, as shown in to FIG. 9, another phase encoding gradient Gyp is activated in the y direction after the excitation phase. In the exemplary embodiment, this phase encoding gradient can be activated in four levels, so that a three-dimensional raw data matrix 4·N·M of four raw data sets is obtained (i.e, a three-dimensional arrangement of at least two raw data sets). As in standard three-dimensional methods, a local resolution is achieved in the third dimension by means of Fourier transformation in the third direction that arises in this way. For a three-dimensional method of this sort, the thickness of the excited layer will be chosen broader, corresponding to the requirements. The resolution inside the layer thickness depends on the number of phase encoding steps in the y direction.

For small subjects, e.g. in the knee region, under certain circumstances the layer selection during excitation could also be forgone, i.e., the oscillating gradient $G_y$ would be omitted. In this case, the above-explained resolution of the subject in the y direction would then usefully be executed by the above-identified phase encoding.

Figure 12:
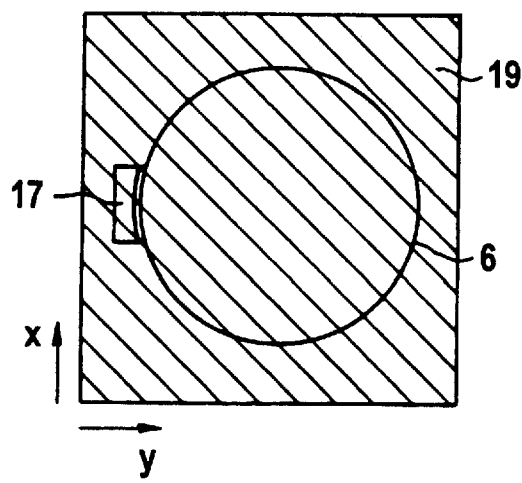
FIG. 12 schematically illustrates a displayed image obtained using the exemplary embodiment of the invention.
Figure 13:
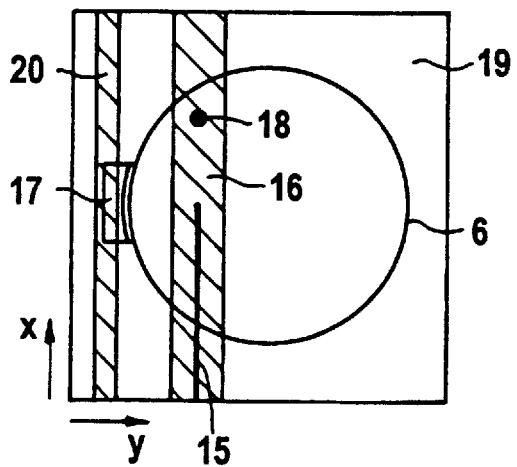
FIG. 13 schematically illustrates a displayed image with motion path obtained using the exemplary embodiment of the invention.

An exemplary embodiment for the application of the wavelet encoding to the task of following the motion of an interventional instrument is explained in the following on the basis of FIGS. 12 and 13. A biopsy needle is used in the exemplary embodiment as an interventional instrument, but other instruments, e.g. surgical instrument, are also possible, as long as the path of motion is at least roughly defined.

For the physician, the important thing is to determine the position of the biopsy needle 15 in the examination subject with good time and local (spatial) resolution. For this purpose, first a reference image of the overall subject space 19, with the subject of examination 6, is obtained. This is shown schematically in FIG. 12. Of course, this reference image could be obtained with the specified wavelet encoding, i.e. with wavelet-coded excitation of the nuclear resonance signals. In comparison with phase encoding, however, wavelet-coded excitation causes a worse signal-noise ratio. This is due to the fact that during phase encoding signals are always acquired from the overall subject region; in wavelet-coded excitation, in contrast, signals are acquired only from individual strips. In addition, in wavelet encoding small flip angles are used. It is thus advisable first to use standard phase encoding for obtaining the reference image, since here the advantage of wavelet encoding (i.e., the limitation to a region of the subject) is not a factor anyway. In order to make the data set of the reference image (as will be necessary later) compatible with updated, wavelet-coded data sets, the obtained digital raw data matrix is inversely Fourier-transformed for subsequent processing in the phase encoding direction and is subsequently wavelet-coded. The image is thereby partitioned into N strips, corresponding to the factors a and b of the wavelet encoding. After the complete reconstruction (inverse Fourier transformation in the direction of the readout gradient and inverse wavelet encoding in the wavelet encoding direction), a wavelet-coded image is present, whose signal-noise ratio substantially corresponds to a standard spin echo image.

As already mentioned, with conventional Fourier transformation methods it would hardly be possible to achieve a sufficient time resolution for following the motion of the biopsy needle. Since the path of motion of the biopsy needle is, however, already known relatively well, it is sufficient to update only the data sets that lie in the region of the known path of motion 16 of the biopsy needle 15. In FIG. 13, the region 16 of the path of motion to be acquired is shown with cross-hatching, and the target to be reached with the biopsy needle 15 is designated 18. With wavelet encoding it is possible, as described above, to selectively record the region 16. The frequency encoding direction y thereby lies parallel to the direction of motion of the biopsy needle 15, and the wavelet encoding direction x is orthogonal thereto.

Since, for the updating of the raw data, considerably fewer data samples must be acquired from the region 16 in comparison with the subject space 19, this can ensue with correspondingly improved time resolution. If, for example, one proceeds on the basis of an image of size 30×30 cm, with a resolution of 128×128 pixels, updating the overall image requires 128 sequences according to FIGS. 4 to 8. If the region of motion 16 can be limited, however, to for example 20 mm, then only twelve sequences are required for the same local resolution, i.e., the data required for updating can be obtained approximately ten times as quickly. During the intervention, only twelve lines need be updated respectively in the original raw data set comprising the overall reference image. Since, for the reasons named above, the data sets obtained with wavelet encoding have a smaller signal amplitude than the signals of the reference image obtained on the basis of phase encoding, the updated wavelet-coded data sets must be correspondingly normalized.

The image obtained from the raw data sets obtained in this way thus shows the overall subject of examination in good spatial resolution, and also the motion of the biopsy needle 15 in good time resolution. Since the signals from the biopsy needle 15 change between the individual data set updatings only with respect to its tip, the signals from the rest of the biopsy needle are constantly averaged. Despite the low signal intensity due to the wavelet encoding, the biopsy needle 15 is thus shown with a good signal-noise ratio due to the averaging of the signals (with the exception of signals from the moved tip of the biopsy needle).

In the previous discussion, it was assumed that in the region of examination only the biopsy needle 15 moves, while the rest of the subject of examination 6 is immobile. Of course, during a motion of the overall subject of examination 6, the spatial allocation between the updated region 16 and the rest of the subject of examination 6, which was acquired only at the beginning of the measurement in the form of a reference image, is no longer correct. The physician often no longer needs the information from the rest of the subject of examination, since he or she still remembers it during the interventional process. In order to avoid displaying false information, however, it is recommended to remove the reference image as soon as a motion of the subject occurs, and to continue to show only the region 16 of the path of motion.

In order to determine a motion of the subject 6, it is possible to attach, for example, an MR-sensitive marker 17 to the subject. In this case, one can then likewise obtain, e.g. in an additional region 20, wavelet-coded data sets, and can acquire the motion of the marker 17 on the basis of these data sets. As soon as the motion of the marker 17 exceeds a certain threshold value, the reference image is removed.

An alternative it is also possible to update the reference image, i.e. the data set for the complete subject of examination 6, as soon as a larger motion of the subject 6 has seen determined.

In the previous display, the path of motion was in the y direction, and wavelet encoding of the nuclear resonance signals was undertaken in the x-direction and frequency encoding the nuclear magnetic resonance signals was undertaken in the y-direction. The method is not limited to a rigid coordinate system, however, since in MR equipment, by means of simultaneous activation of several gradients, resulting gradients can be realized in arbitrary directions.

In order to show the biopsy needle in the image with good contrast, it can advantageously be filled with a negative contrast means, e.g. iron oxide. It is then displayed in black in the image.

With the above-identified method, it is thus possible to follow the motion of an interventional instrument with good time resolution, since at all times only a small part of the overall data set is updated, and since short data acquisition times are possible. By the use of a gradient echo sequence with rapid repetition, the data acquisition time is further reduced. The characteristic of the wavelet function of allowing the data recording to be localized, in comparison with phase encoding, which always extends over the entire subject of measurement, thereby has a particularly positive effect. At the same time, the method also however delivers a high local resolution. During the acquisition of the reference image with the standard phase encoding, a high-quality image can be produced by means of the high signal-noise ratio that is thereby achievable. In the region of the path of motion, the less favorable signal-noise ratio, associated with the wavelet encoding, is further improved by averaging the sequentially obtained data.

Understandably, various changes and modifications to the presently preferred embodiments described herein will be apparent to those skilled in the art. Such changes and modifications can be made without departing from the spirit and scope of the present invention and without diminishing its attendant advantages. Therefore, the appended claims are intended to cover such changes and modifications.

We claim as our invention:

1. A method for obtaining image information from a subject by generating and processing nuclear magnetic resonance signals, comprising the steps of:

(a) in an excitation phase, emitting an RF pulse in a homogeneous magnetic field, said RF pulse having an envelope corresponding to Fourier transforms of a wavelet function, and during emission of said radio frequency pulse generating a constant magnetic field gradient in a first direction and generating a further gradient magnetic field with a time-varying amplitude and a linear local dependency in a second direction;

(b) in a readout phase, sampling a gradient echo signal under a readout gradient in a third direction arising as a result of the excitation phase, digitizing the sampled gradient echo signal and entering the digitized, sampled gradient echo signal into a line of a raw data matrix;

(c) repeating steps (a) and (b) N times with a different wavelet encoding in each repetition and thereby generating a raw data matrix having N lines; and (d) producing a image matrix from said raw data matrix by Fourier transformation in the third direction and wavelet transformation in the first direction.

2. A method as claimed in claim 1 wherein the step of generating said further gradient magnetic field comprises generating a linear gradient magnetic field in said second direction with an amplitude changing sinusoidally with time.

3. A method as claimed in claim 2 wherein said further gradient magnetic field has an oscillation frequency associated therewith, and comprising the additional step of setting said oscillation frequency for defining a layer thickness selected in said excitation phase.

4. A method as claimed in claim 2 comprising the further step of setting the amplitude of said additional gradient magnetic field for definition of a layer thickness selected in the excitation phase.

5. A method as claimed in claim 2 comprising the further step of setting a zero-crossing of said additional gradient magnetic field for definition of a layer position of a selected in the excitation phase.

6. A method as claimed in claim 1 comprising the additional steps of:

following emission of said addition gradient magnetic field, emitting a phase-encoding gradient in said second direction;

altering said phase-encoding gradient in at least one of the repetitions of step (a) and thereby generating a three-dimensional arrangement of at least two raw data sets; and selecting a local resolution with a layer selected in said excitation phase by Fourier transformation of said at least two raw data sets in said third direction.

7. A method as claimed in claim 1 wherein nuclear spins are produced in said excitation phase having a longitudinal relaxation time and a transverse relaxation time, and wherein step (c) comprises repeating steps (a) and (b) with a repetition time which is shorter than said longitudinal and transverse relaxation times.

8. A method as claimed in claim 1 comprising the additional step of after each readout phase, emitting spoiler gradient pulses in at least one direction.

9. A method as claimed in claim 1 comprising the additional steps of:

during steps (a), (b), (c) and (d), inserting an interventional instrument into said subject along a motion path in said third direction, and updating said raw data sets with a repetition rate only for wavelet encodings allocated to a region containing said motion path.

10. A method as claimed in claim 9 comprising the additional step of obtaining a raw data set comprising a reference image of said subject, and comprising the additional step of mixing said updated raw data sets into said reference image.

11. A method as claimed in claim 10 wherein the step of obtaining the raw data set for said reference image with a magnetic resonance imaging method with phase coding of the nuclear magnetic resonance signals in the second direction, and comprising the additional step of wavelet encoding said raw data set comprising said reference image in the second direction.

12. A method as claimed in claim 9 comprising the additional step of obtaining a new raw data set comprising a new reference image upon any motion of said subject exceeding a threshold value.

13. A method as claimed in claim 12 comprising the additional step of monitoring motion of said subject using a marker attached to said subject, said marker being identifiable in data in said raw data matrix.

14. A method as claimed in claim 13 comprising the additional step of acquiring the data identifying said marker with wavelet encodings allocated to said marker and updated with a repetition rate.

15. A method as claimed in claim 9 comprising the additional step of updating the data sets for the wavelet encodings allocated to said region containing said path of motion with a repetition rate correlated with a speed of insertion of said interventional instrument for displaying said interventional instrument with a time resolution substantially corresponding to real time.

* * * * *